(12) United States Patent
Koechlin

(10) Patent No.: US 6,295,020 B1
(45) Date of Patent: Sep. 25, 2001

(54) MASTER FREQUENCY GENERATOR

(75) Inventor: Michael Koechlin, Chelmsford, MA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/379,645

(22) Filed: Aug. 23, 1999

(51) Int. Cl.[7] ................................................. G01S 13/00
(52) U.S. Cl. ........................ 342/175; 342/13; 342/16; 342/61; 342/62; 331/78; 375/132; 327/105
(58) Field of Search ......................... 375/130–137; 331/46–56, 60, 78; 342/25, 27, 28, 52, 59, 61, 62–65, 73, 82, 165, 168–174, 175, 176, 179, 180, 181, 200, 201, 13–20, 152, 367; 327/100, 105, 106, 107

(56) References Cited

U.S. PATENT DOCUMENTS

| | | | |
|---|---|---|---|
| 3,981,012 | * | 9/1976 | Brault et al. ........................ 342/201 |
| 4,135,189 | * | 1/1979 | Josse ..................................... 342/18 |
| 4,527,161 | * | 7/1985 | Wehner ............................... 342/152 |
| 4,725,786 | | 2/1988 | Papaieck . |
| 4,739,186 | * | 4/1988 | Crookshanks .................. 342/201 X |
| 5,166,629 | | 11/1992 | Watkins et al. . |
| 5,745,075 | * | 4/1998 | Enge et al. ........................... 342/367 |
| 6,184,817 | | 2/2001 | Koechlin ................................ 342/62 |

* cited by examiner

Primary Examiner—Bernarr E. Gregory
(74) Attorney, Agent, or Firm—Sidley Austin Brown & Wood; Stephen S. Sadacca

(57) ABSTRACT

A system is provided for generating multiple frequencies in a specified frequency band, with a specified step size between frequencies, in which the spectral purity of the frequencies is assured. The switching speed between frequencies is very fast, limited only by the speed of the switches used. In one embodiment, only five tones are generated as the base for the rest of the synthesis, in which the relationship of the five tones is $f_0 +/- \frac{1}{8}f_0$ and $+/- \frac{1}{16}f_0$. The subject system in one embodiment, utilizes a channel synthesizer and a doppler offset synthesizer which may be utilized in air defense systems for generating the transmit channels to be able to permit a missile seeker to transmit a signal at the appropriate frequency. In one embodiment, spectral purity is achieved by providing a number of stages of up converting, expanding, and dividing down of an input signal.

15 Claims, 11 Drawing Sheets

MAIN FREQUENCY SPACING $F_E - F_D = F_D - F_C = F_C - F_B = F_B - F_A = K$ step size $= \dfrac{K}{128} = D$ $F_{agility}$ min $= \dfrac{41}{128} F_A$ $F_{agility}$ max $= \dfrac{41}{128} F_A + \dfrac{K}{4}(4 + \dfrac{1}{2} + \dfrac{3}{8} + \dfrac{3}{32})$ $= \dfrac{41}{128} F_A + \dfrac{K}{4}(4 + \dfrac{31}{32})$ $\boxed{\dfrac{1}{16} F_C = K}$ $\Big\}$ $F_C = 16 * 12$ $K = 128\, D$ $N_1 = N_2 = N_3 = N_4 = 0$ $N_3 = N_4 = 3$ $N_2 = 1$ $N_1 = 4$

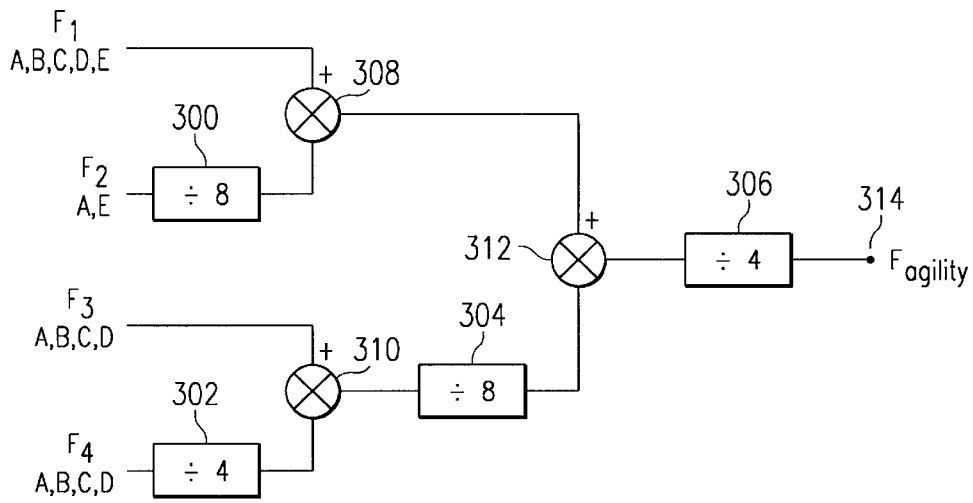

*FIG. 11*

$$F_{agility} = \frac{F_1}{4} + \frac{F_2}{32} + \frac{F_3}{32} + \frac{F_4}{128}$$

$F_1 = F_A + N_1 * K \qquad N_1 = 0,1,2,3,4$ $F_2 = F_A + N_2 * 4 * K \qquad N_2 = 0,1$ $F_3 = F_A + N_3 * K \qquad N_3 = 0,1,2,3$ $F_4 = F_A + N_4 * K \qquad N_4 = 0,1,2,3$ $$F_{agility} = \frac{(F_A + N_1*K)}{4} + \frac{(F_A + N_2*4*K)}{32} + \frac{(F_A + N_3*K)}{32} + \frac{(F_A + N_4*K)}{128}$$

$$= \frac{F_A}{4}\left(1 + \frac{1}{8} + \frac{1}{8} + \frac{1}{32}\right) + \frac{K}{4}\left(N_1 + \frac{N_2}{4} + \frac{N_3}{8} + \frac{N_4}{32}\right)$$

$$\longrightarrow = \frac{41}{128} F_A + \frac{K}{4}\left(\frac{N_1}{1} + \frac{N_2}{2} + \frac{N_3}{8} + \frac{N_4}{32}\right)$$

*FIG. 12*

EXAMPLE
2.5 MHZ steps
$F_C = 16 * 128 * 2.5 = 5120$ MHZ
$K = 128 * 2.5 = 320$ MHZ
$F_A = 5120 - 2 * 320 = 4480$ MHZ
$F\ min\ Agility = \frac{41}{128} F_A = 1435$ MHZ
$F\ max\ Agility = 1435 + \frac{320}{4}(4+\frac{31}{32})$
$= 1832.5$ MHZ $$F_{agility} = \frac{F_A}{4}\left(1+\frac{1}{8}-\frac{1}{8}-\frac{1}{32}\right)+\frac{K}{4}\left(N_1+\frac{N_2}{2}-\frac{N_3}{8}-\frac{N_4}{32}\right)$$

EXAMPLE
$F\ min\ Agility = \frac{31}{32} F_A + \frac{320}{4}\left(-\frac{3}{8}-\frac{3}{32}\right)$
$= 1085 - 37.5$
$= 1047.5$ MHZ $F\ max\ Agility = 1085 + \frac{320}{4}\left(4+\frac{1}{2}-0-0\right)$
$= 1445$ MHZ $$F_{agility} = \frac{F_A}{4}\left(1 - \frac{1}{8} - \frac{1}{8} - \frac{1}{32}\right) + \frac{K}{4}\left(N_1 - \frac{N_2}{2} - \frac{N_3}{8} - \frac{N_4}{32}\right)$$

EXAMPLE $$F\ min\ Agility = \frac{23}{32 \cdot 4} 4480 - \frac{320}{4}\left(\frac{1}{2} + \frac{3}{8} + \frac{3}{32}\right)$$

$$= 805 - 77.5 = 727.5\ MHZ$$

$$F\ max\ Agility = 805 + \frac{320}{4}(4)$$

$$= 1125\ MHZ$$

$$F_{agility} = \frac{F_A}{4} \cdot \frac{25}{32} + \frac{K}{4}\left(N_1 - \frac{N_2}{2} - \frac{N_3}{8} + \frac{N_4}{32}\right)$$

EXAMPLE $$F\text{ min Agility} = 875 + \frac{320}{4}\left(-\frac{1}{2} - \frac{3}{8}\right)$$
$$= 805 \text{ MHZ}$$

$$F\text{ max Agility} = 875 + \frac{320}{4}\left(4 + \frac{3}{32}\right)$$
$$= 1202.5 \text{ MHZ}$$

SUMMARY OF POSSIBLE AGILITY OUTPUT
FREQUENCES FOR GIVEN EXAMPLE

|     | $F_{Low}$ | $F_{High}$ | step | BW |
|-----|-----------|------------|------|-------|
| I   | 1435      | 1832.5     | 2.5  | 397.5 |
| II  | 1047.5    | 1445       | 2.5  | 397.5 |
| III | 727.5     | 1125       | 2.5  | 397.5 |
| IV  | 805       | 1202.5     | 2.5  | 397.5 |

$$F_{out} = (F_i \cdot N_S \pm F_{agility}) \times N_T \pm F_{Doppler}$$
Let $N_S + 2,3,4, N_T = 2$, $F_i = 4480, 4800, 5120, 5440, 5760$
$727.5 \leq 1832.5$      $3200 \leq F_{Doppler} < 5760$

| | | | | | | | | | | | |
|---|---|---|---|---|---|---|---|---|---|---|---|
| | 727.5 | 1832.5 | | | | | | | | | |
| | | LO | LO | LOWER SIDEBAND | UPPER SIDEBAND | | | LO | LOWER SIDEBAND | UPPER SIDEBAND | LO |
| | | 324 | 326 | 326 f low | 326 f high | 326 f low | 326 f high | 328 | 320 f low | 320 f low / 320 f high | 320 f low / 320 f high | LO |
| 4480 | | 3 | 13440 | 11607.5 | 12712.5 | 14167.5 | 15272.5 | 2 | 23215 | 25425 | 28335 | 30545 |
| 4800 | | 3 | 14400 | 12567.5 | 13672.5 | 15127.5 | 16232.5 | 2 | 25135 | 27345 | 30225 | 32465 |
| 5120 | | 3 | 15360 | 13527.5 | 14632.5 | 16087.5 | 17192.5 | 2 | 27055 | 29265 | 32175 | 34385 |
| 5440 | | 3 | 16320 | 14487.5 | 15592.5 | 17047.5 | 18152.5 | 2 | 28975 | 31185 | 34095 | 36305 |
| 5760 | | 3 | 17280 | 15447.5 | 16552.5 | 18007.5 | 19112.5 | 2 | 30895 | 33105 | 36015 | 38225 |

| | | |
|---|---|---|
| 3200 | 23215 | 38225 |
| 5760 | 26415 | 41425 |
| | 28975 | 43985 |

| | | |
|---|---|---|
| 3200 | 23215 | 38225 |
| 5760 | 20015 | 35025 |
| | 17455 | 32465 |

FIG. 27

MASTER FREQUENCY GENERATOR

FIELD OF INVENTION

This invention relates to the generation of multiple frequencies, and more particularly to the utilization of a minimum number of base frequencies or tones, in order to generate a large number of spectrally pure preselected frequencies.

BACKGROUND OF THE INVENTION

It will be appreciated that in air defense systems, an incoming missile is counter-measured through the utilization of an interceptor missile, which is guided towards the incoming missile through attitude control and millimeter wave radar techniques. In order to be able to intercept an incoming missile with current attitude adjusting technology, it is important to be able to transmit millimeter radar signals in hundreds of frequency channels so that the frequency can be hopped amongst channels to avoid jamming. Moreover, it is important that these frequencies be selectable and available through a switching system in which the transmit frequency can be set rapidly.

In the past, master frequency generators have been employed utilizing a large number of base frequencies or tones in order to be able to synthesize the required channel. In one application, as many as 16 tones were necessary in order to generate the required frequencies with the required spectral purity. In addition to generating the 16 tones, multipliers, dividers, and mixers were combined to provide the large number of frequencies required. For instance, in one application, 100 channels are needed to be generated. The result of such a master frequency generator was that the number of parts necessary was excessive, which both added weight and resulted in high power consumption in an application, which because of its intended use, must be extremely lightweight and extremely parsimonious in its power consumption.

In general, for interceptor missiles, it is the kinetic energy of the missile that takes out the incoming missile, as opposed to explosives that utilize proximity fuses to be able to accomplish the task. Thus, it is desirable to minimize the mass of the components in the missile to be able to maximize the velocity. This is because the energy in the collision is proportional to the square of the velocity. The number of components also obviously adds considerably to the cost of the entire system, such that any system that can minimize the parts count is desirable.

In the interceptor missile application, as mentioned before, it is a requirement to generate hundreds of channel frequencies and to be able to hop between frequencies to avoid jamming. Secondly, channels permit profiling the incoming missile as to its attitude or orientation, as well as its physical characteristics, to determine the most lethal point of impact, and this requires hundreds of channels.

SUMMARY OF THE INVENTION

In order to accomplish the generation of hundreds of channels with high accuracy, low phase noise, low spurious content and fast switching, in one embodiment, five base frequencies or tones are generated, with a relationship between the tones being $f_0 +/- \frac{1}{8}f_0$ and $+/- \frac{1}{16}f_0$. After much research into the various tradeoffs between different synthesizer techniques, a solution was found which permits utilization of only five tones to generate hundreds of channels with a master frequency generator utilizing one half the parts count previously thought necessary.

In one embodiment, one first determines the desired step size between the multiple frequencies to be generated, which is usually a system requirement. With a fixed configuration of dividers and mixers designed to permit generation of a predetermined number of different frequencies with the above step size, then one can specify the center tone as being the step size x, a number reflecting the one over the base tone spacing (i.e. 16), multiplied by a number determined by the specific configuration. In one embodiment, for a circuit which can generate 160 different frequencies, the center tone is step size×16×128, where the basic step size is the tone spacing divided by 128, and where the tone spacing is defined as $\frac{1}{16}$ of the center tone.

Thus, setting the tone spacing=$F_c/16$=128×step size, $F_c$=16×128×step size. Having specified the center or base tone, one can generate the other four tones based on the above $+/- \frac{1}{8}f_0$ and $+/- \frac{1}{16}f_0$ relationship.

In one example, with three mixers and four dividers, and with selected dividers providing a divide-by-4 or a divide-by-8 function, it can be shown that 160 different frequencies can be generated from five tones, with the frequency generated $$f_{agility} = \frac{41}{128} F_A + \frac{K}{4}(N_1/1 + N_2/2 + N_3/8 + N_4/32),$$

where $F_A$ is the lowest tone, where K is the tone spacing, and where N is either 0 or an integer.

It will be appreciated that in the past, the simplest way of generating multiple frequencies was to utilize a phase locked oscillator at the output frequency. This technique was, however, found to be woefully short of being able to generate the frequencies without considerable phase and spurious noises and a slow switching speed.

It will also be appreciated that there are an infinite number of solutions that can be tried in order to accommodate the number of frequencies to be generated with the minimum number of tones. There are also an infinite number of combinations of multipliers, dividers, mixers and oscillators to be able to achieve the desired result. It is noted that one prior art master frequency generator has a parts count of 328 components. These components are mixers, filters, KA amplifiers, microwave amplifiers, dividers, regulators, cables and a Doppler VCO. In contradistinction to the prior master frequency generator in the subject system, in one embodiment only 155 components need be utilized.

In the preferred embodiment, a fixed oscillator is used in combination with dividers and mixers to generate the five basic tones. These five basic tones are then combined in three additional mixers to generate the hundreds of frequencies required for the above-mentioned channels. The combining circuit in one embodiment includes divide-down circuits, which in combination with the mixers, minimizes spurs by up-conversion, expansion and divide-down steps to provide the required spectral purity.

In summary, a system is provided for generating multiple frequencies in a specified frequency band, with a specified step size between frequencies, in which the spectral purity of the frequencies is assured. The switching speed between frequencies is very fast, limited only by the speed of the switches used. In one embodiment, only five tones are generated as the base for the rest of the synthesis, in which the relationship of the five tones is $f_0 +/- \frac{1}{8}f_0$ and $+/- \frac{1}{16}f_0$. The subject system in one embodiment, utilizes a channel synthesizer and a doppler offset synthesizer which may be utilized in air defense systems for generating the transmit channels to be able to permit a missile seeker to transmit a signal at the appropriate frequency. In one embodiment, spectral purity is achieved by providing a number of stages of up converting, expanding, and dividing down of an input signal.

BRIEF DESCRIPTION OF THE DRAWINGS

These and other features of the Subject Invention will be better understood taken in connection with the Drawings, in conjunction with the Detailed Description of which;

FIG. 11 is a schematic diagram of one embodiment of the subject invention in which numerous frequencies are generated through the utilization of 3 mixers and 4 dividers, in which the dividers either divide the incoming signal by 4 or 8;

FIG. 12 is a series of equations for specifying the frequency generated by the circuit of FIG. 11, in which all mixers are configured to output the upper side band;

DETAILED DESCRIPTION

Figure 1:
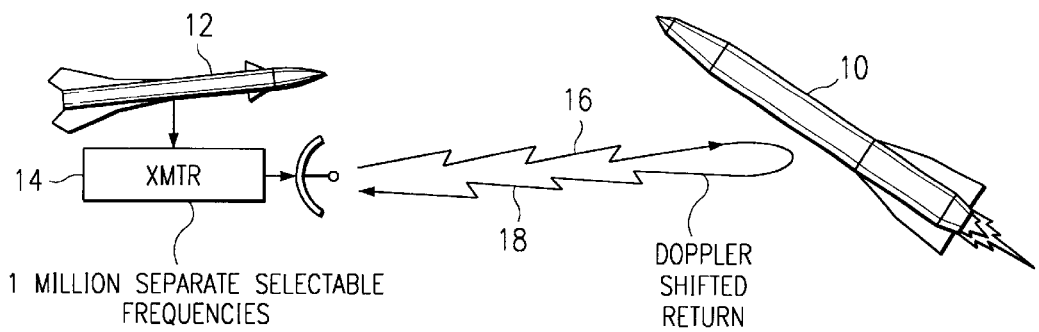
FIG. 1 is a diagrammatic illustration of an incoming and interceptor missile scenario, in which a radar at the interceptor missile illuminates the incoming missile and analyzes the returns therefrom.

Referring now to FIG. 1, in one interceptor-type scenario, an incoming missile 10 is to be intercepted by an interceptor missile 12, which determines the position of the incoming missile through the utilization of signals illuminating the target. As illustrated, a transmitter 14 emits radiation 16 towards the missile and detects reflected radiation 18, whereupon attitude adjustment apparatus within missile 12 steers the interceptor missile towards the incoming missile.

As mentioned hereinbefore, it is only with difficulty that the exact position or trajectory of the incoming missile can be ascertained to the point that a collision between two missiles traveling at a high rate of velocity can be made to occur. In the above scenario, it is important to be able to switch the output of transmitter 14 to one of a variety of different frequencies to generate the aforementioned channels to take into account such things as countermeasure radiation, which must be taken into account in terms of shifting the channel in which the transmitted radiation lies, to avoid jamming radiation. Additionally, as mentioned above, projecting radiation in a number of different channels permits profiling the incoming missile so as to assure the most effective hit.

Figure 2:
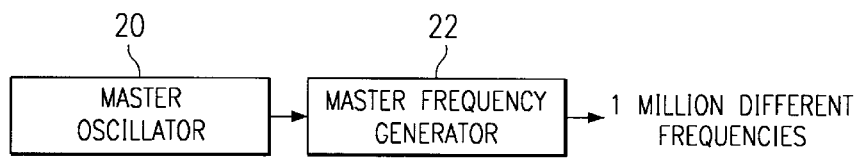
FIG. 2 is a block diagram of a system for generating multiple frequencies in which a master oscillator is coupled to a master frequency generator, which generates the frequencies required with the required spectral purity, low phase noise and low spurious content through the utilization of only five tones.

Referring now to FIG. 2, in general, a master oscillator 20 is utilized to provide a fixed frequency, which is then processed by a master frequency generator 22 so as to provide transmitter 14 of FIG. 1 with the required frequency. In general, it is important to be able to provide that transmitter 14 emit radiation at a number of selectable frequencies for the above mentioned channel selection. Typically, the number of channels utilized in such a situation is in the hundreds.

As mentioned above, it is somewhat a daunting task to be able to generate hundreds of frequencies through the utilization of traditional master frequency generators. In the past, a master frequency generator oftentimes needs to generate sixteen different tones in order to provide the frequencies required not only for the transmitter, but also for the receiver and the further processing of the received signals.

Figure 3:
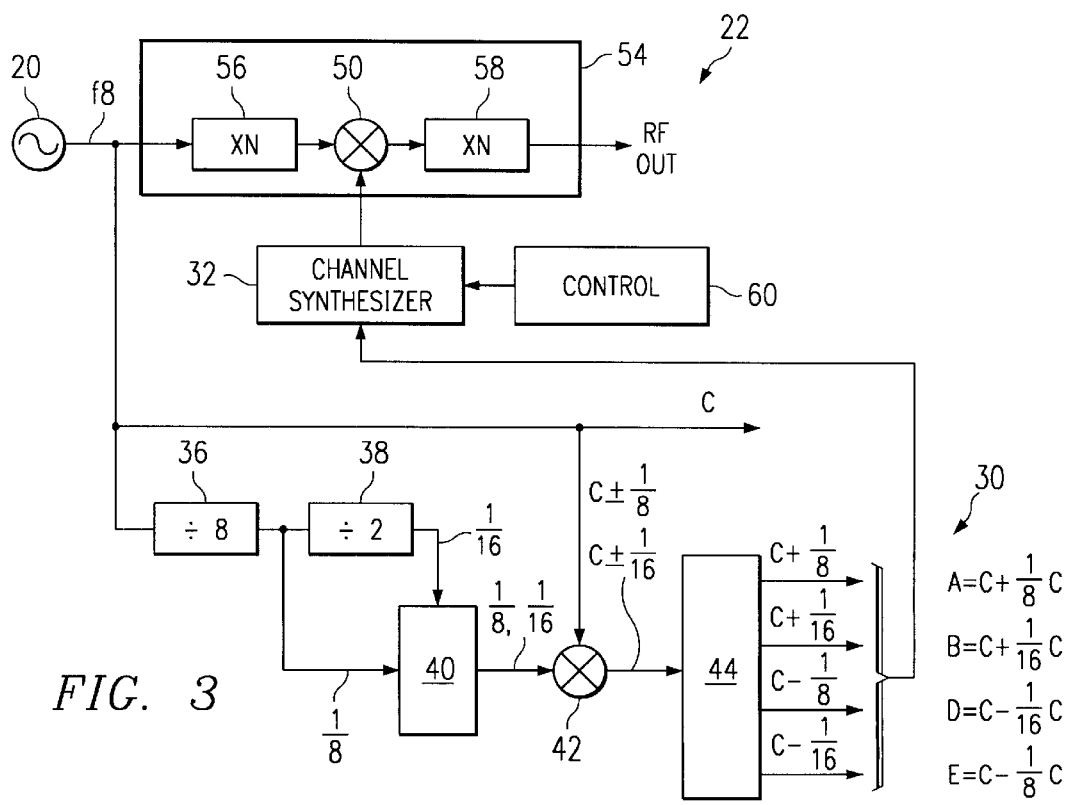
FIG. 3 is a block diagram of the subject master frequency generator, illustrating the generation of the five tones, and the supplying of the five tones by a synthesizer which generates a number of channels to provide an RF output at hundreds of different selectable frequencies.

Referring now to FIG. 3, in the subject system master frequency generator 22 provides at its output, five tones, here illustrated at 30, which are utilized by a channel synthesizer 32. The five tones are quite simply generated by multiplying the fixed frequency $f_0$ by $+/-\frac{1}{8}f_0$ and $+/-\frac{1}{16}f_0$. It is a unique finding of this invention that all the required frequencies for a seeker can be generated with just 5 tones, and more particularly, tones with the indicated relationships, e.g. $A=C+\frac{1}{8}C$; $B=C+\frac{1}{16}C$; $D=C-\frac{1}{16}C$; and $E=C-\frac{1}{8}C$.

In one embodiment, the tones are generated by providing a divide-by-8 divider 36, followed by a divide-by-2 divider 38, the outputs of which are applied to a combiner 40, which then feeds the IF port of a two-input port mixer 42. The first of the inputs is the direct output of oscillator 20, namely $f_0$, whereas the second input is from combiner 40.

In one embodiment, combiner 40 can be conceived as a diplexer fed backwards, or a reverse Wilkinson combiner. The purpose of the combiner is merely to provide an output which is divided down by ⅛ and ½. Mixer 42 provides the $+/-\frac{1}{8}$ and $+/-\frac{1}{16}$ multiplier for $f_0$. Mixers in general operate to provide the sum and difference of two input signals. In the illustrated case there are actually three different frequencies being multiplied, thereby to provide four different tones. The fifth tone is merely the $f_0$ fixed frequency. The output of mixer 42, as well as the fixed frequency output of oscillator 20, is provided to a quadraplexer 44, the purpose of which is to provide four separate and distinct frequency tones or outputs from the input signals. The fifth tone is $f_0$. Quadraplexers in general are well known, and have been described as filter banks or channelizers, the purpose of which is to provide frequency separation for an input signal.

As illustrated, the five tones are used in various combinations for channel synthesizer 32, with the outputs of synthesizer 32 going to mixer 50 in an up-converter 54. This unit up-converts the channel frequency through the utilization of a multiplier 56, which multiplies the fixed frequency from oscillator 20 by a predetermined integer. The output of mixer 50 is then itself multiplied by an integer at multiplier 58. Channel selection is provided by frequency controller 60.

Figure 4:
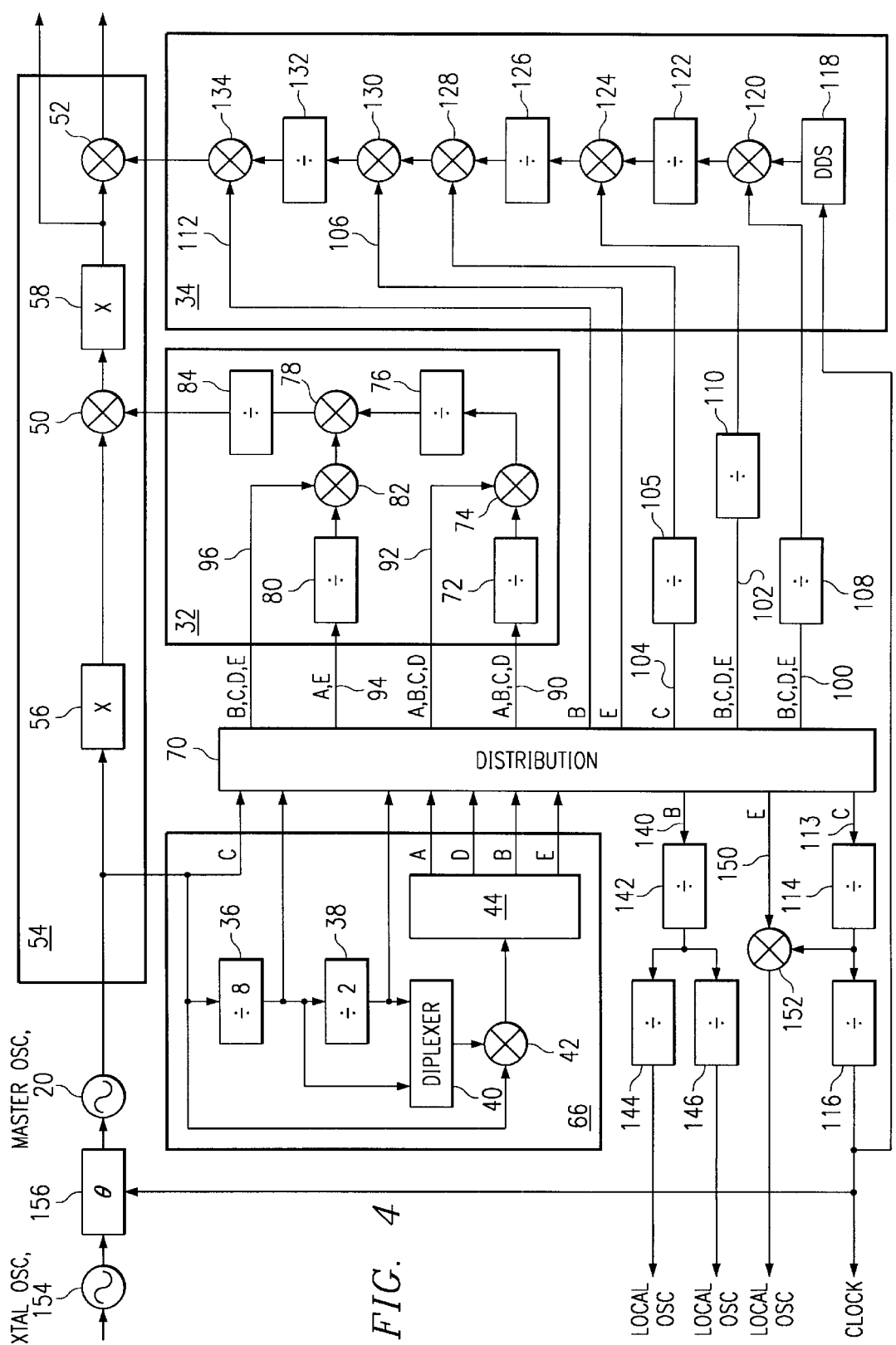
FIG. 4 is an expanded block diagram of the master frequency generator of FIG. 3, illustrating the distribution of the five different frequencies from a base frequency generation unit to the channel synthesizer.

Referring now to FIG. 4 in which like reference characters specify like elements, as will be seen, master oscillator 20 provides an input to up converter and Doppler combiner 54, with its output also utilized for base frequency generator 66 utilizing the elements of FIG. 3. It will be appreciated that the five tones in this case are designated A, B, C, D and E, where $A=C+\frac{1}{8}C$; $B=C+\frac{1}{16}C$; $D=C-\frac{1}{16}C$ and $E=C-\frac{1}{8}C$. These frequencies are applied to a distribution unit 70, which selectively provides either A, B, C or D to channel synthesizer 32, which includes a mixer 74 having its other input the output of divider 72. The other input to IF mixer 78 is either the A or E tones which are divided down by divider 80 and provided to a mixer 82, the other input of which is the tone B, C, D or E. The output of mixer 78 is divided down by a divider 84, with the output thereof being provided to mixer 50 of the combiner. Channel synthesizer unit 32 is capable of providing hundreds of different frequencies which are switched by distribution unit 70, which switches between the various frequencies.

An algorithm for switching among A, B, C, D and E tones to achieve a particular frequency is described in connection with FIGS. 11–25 hereinafter.

Most importantly, because of the upconversion, expansion and divide-down provided by channel synthesizer 32, spurs are reduced, which increases the spectral purity of the signal.

It will be appreciated that distribution unit 70 switches the A, B, C, D, or E inputs one at a time to channel synthesizer 32, with unit 70 performing a full axis matrix switch function.

In summary, the output of quadraplexer 44, along with the base frequency fo is selectively switched over lines 90, 92, 94 and 96, such that at any given time, either A, B, C, or D is supplied over line 90, A, B, C or D is supplied over line 92, A or E is supplied over line 94, and B, C, D or E is supplied over line 96.

As to the Doppler offset synthesis, it will be appreciated that the output of distribution unit 70 is in one instance B, C, D, or E supplied over line 100; B, C, D, or E supplied over line 102; C supplied over line 104; and E supplied over line 106. A divider 105 is provided to divide-down the signal over line 104. A divider 108 is provided to divide down the signal over line 100, whereas a divider 110 is provided to divide-down the signal over line 102. It will be appreciated that B is provided over line 112 as illustrated.

The divided down or original signals from lines 100, 102, 104, 106 and 112 are provided to Doppler offset synthesizer 34. This synthesizer requires a number of signals. First, distribution unit 70 provides a clock signal by dividing down the signal C over line 113 by divider 114, and further dividing it down by divider 116 such that this clock signal is provided to a direct digital synthesizer 118 in synthesizer 34, with synthesizer 118 being conventional in nature. The output of the direct digital synthesizer is upconverted by the mixer 120, with the divided-down signal over line 100, with the output of mixer 120 being divided at divider 122 to eliminate spurs. The divided down output is then provided to another upconvert mixer 124, which is provided with a divided down signal over line 102. The output of mixer 124 is again divided down by a divider 126 for further spurious signal rejection. The divided down output is provided to a mixer 128, which is provided with the divided down signal over line 104. The output of mixer 128 is provided to a mixer 130, which is provided with signal E over line 106. The output of mixer 130 is divided down by a divider 132 for further spurious signal rejection. The output of divider 132 is applied to a mixer 134 having as its input signal, the signal provided over line 112. The output of mixer 134 is then provided to mixer 52 for providing the large number of spurious-free frequencies.

The purpose of the direct digital synthesizer 118 is to be able to generate a large number of discreet frequencies. In order to achieve spectral purity for these frequencies, a number of stages of spur rejection are provided. In each stage, an input signal is upconverted and expanded by the associated mixer. After upconverting and expansion, the signal is divided back down for spurious improvement characteristic purposes. After a number of such stages, in one embodiment, an overall divided ratio of 64 is provided. This achieves a 36 dB improvement in the spurious performance of direct digital synthesizer 18. It will be appreciated that direct digital synthesizer 18 used alone, has significant spurious components. By utilization of the upconvert expansion and divide chain, one can reduce the level of spurious signals to an acceptable level.

It will be appreciated that frequencies useable for the remainder of the seeker can also be generated from the outputs of distribution unit 70. For instance, the B tone delivered over 140 may be divided down by divider 142, which may itself be divided down by a divider 144 or a divider 146, to provide two different local oscillator reference frequencies. Likewise, the E tone which may be provided over line 150 can be provided to one input of mixer 152, the other input being the output of divider 114, such that a third local oscillator reference frequency can be generated for use otherwise in the seeker. It will be appreciated that these particular frequencies are not switched, but are conveniently available from distribution unit 70 for other purposes.

Figure 5:
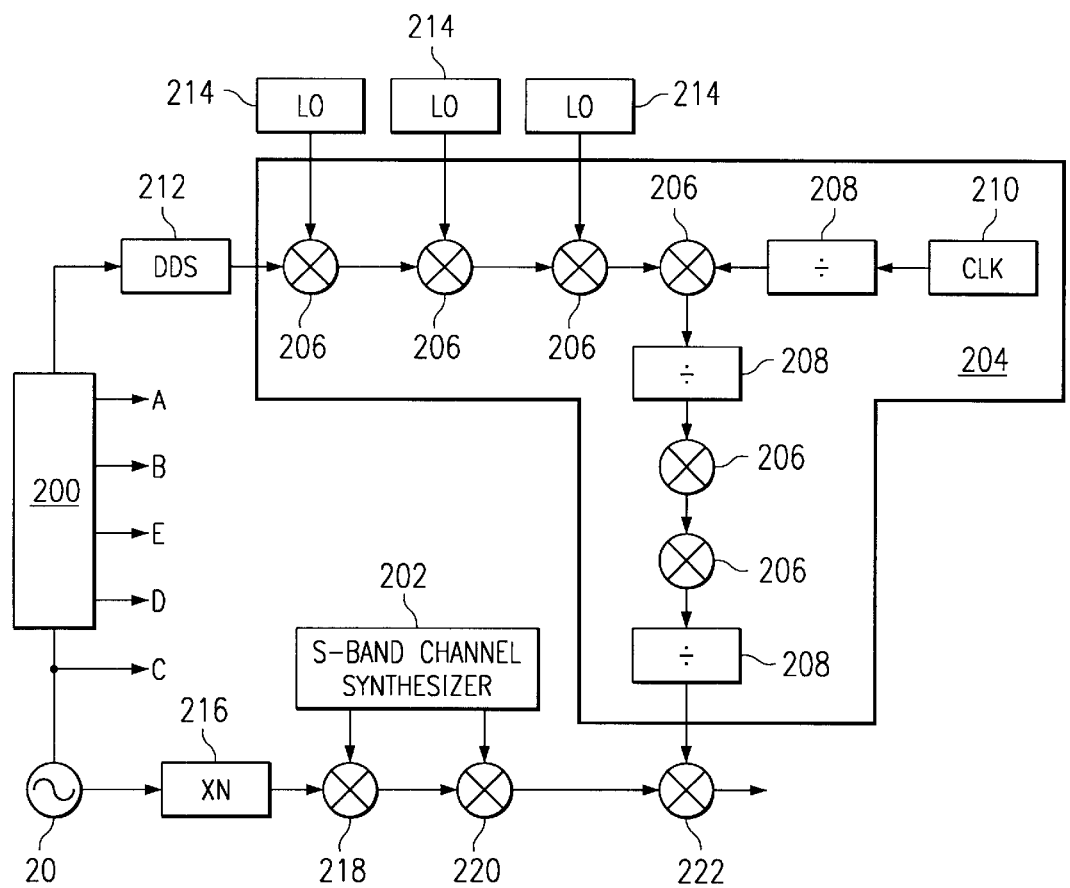
FIG. 5 is a schematic diagram of a prior art master frequency generator, illustrating the number of components necessary to provide for the multiple frequency output.

Referring now to FIG. 5, in the prior art, in one embodiment, a master frequency generator 200 was composed of six mixers 206 and a number of band pass filters utilized throughout this unit, with one of the band pass filters being shown at 208. Also shown are local oscillators 214, one of which had 4 parts, one of which had 3 parts, and one of which had 6 parts. In one embodiment, phase locked oscillator 210 had 5 parts, for a total of at least 25 parts for this portion of the master frequency generator. S band channel synthesizer 202 had 19 parts, whereas the millimeter wave circuit upconverter has a multiplier 216, an upconverter mixer 218, and an upconverter mixer 220, the output of which is applied to an upconverter mixer 222 for a parts count of 8 parts, including 5 parts for the local oscillator.

Figure 6:
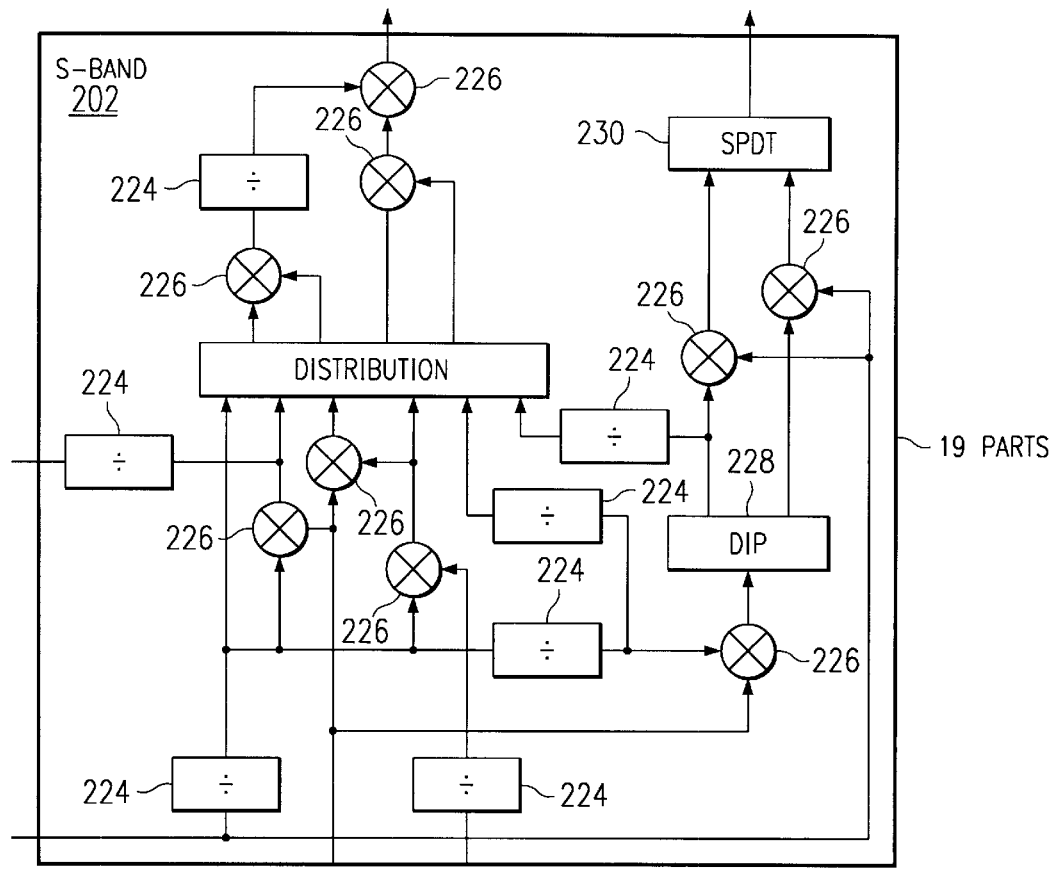
FIG. 6 is a schematic diagram of the channel synthesizer of FIG. 5.

Referring now to FIG. 6, the S band channel synthesizer has 19 parts associated with it, there being a number of dividers 224, a number of mixers 226, a diplexer 228, and a single-pole double-throw switch 230. As a result, the sum total of all of the parts necessary for this master frequency generator grew to 328 parts, including Doppler offset circuits not described here.

What will be readily apparent is that the prior art master frequency generators were indeed complex, having to generate numbers of different basic tones, and having a large number of processing elements to provide the required outputs.

Figures 7, 13:
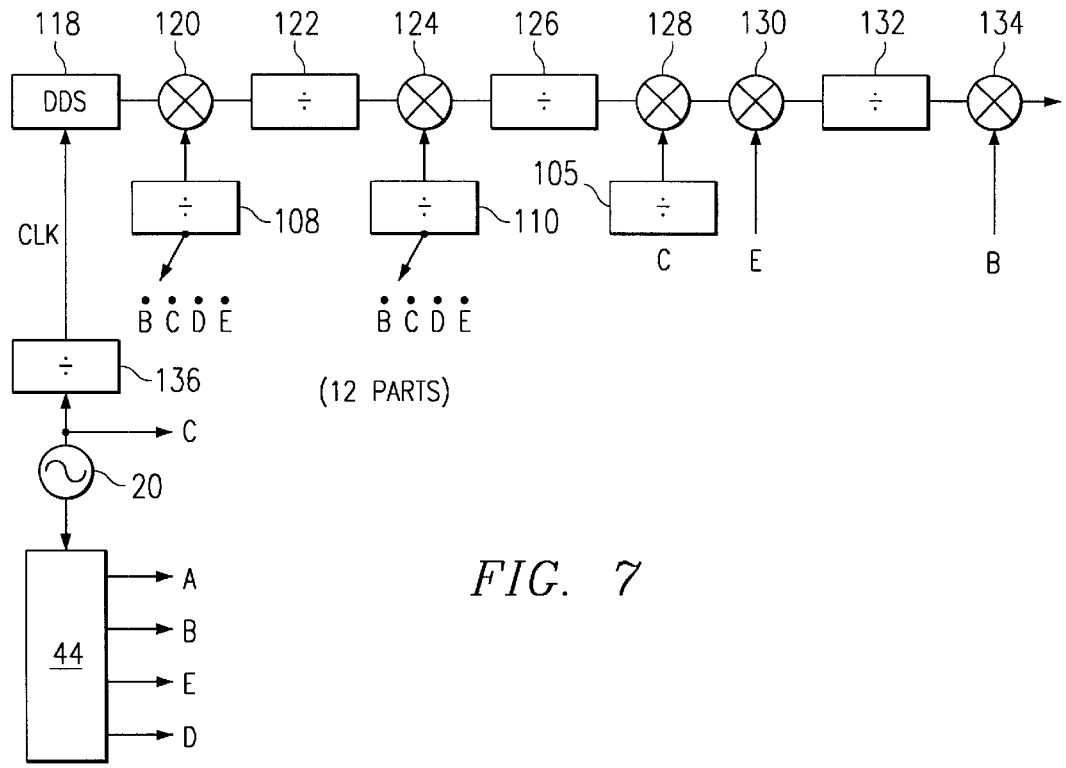
FIG. 7 is a schematic diagram illustrating the Doppler offset synthesizer of FIG. 4, illustrating the selectability of the various frequencies utilizing the five tones generated by the master frequency generator of FIG. 4, as well as the upconversion, expansion, and division stages, which reduce the spurious content.
FIG. 13 is a series of equations illustrating the step size and the minimum and maximum frequencies obtainable as an output from the circuit of FIG. 11.

Referring now to FIG. 7, what is shown is that Doppler offset synthesizer 34 of the subject system has only 12 parts, rather than the 25 parts associated with the prior synthesizer.

Figure 8:
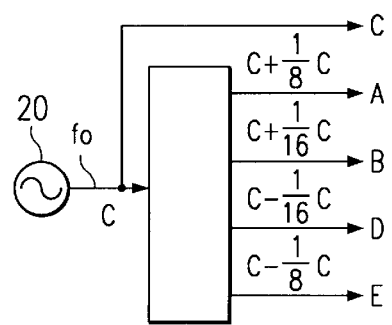
FIG. 8 is a diagrammatic illustration of the algorithm utilized in the generation of the five tones, in which a fixed frequency oscillator has its center frequency $f_0$ varied by $+/- \frac{1}{8} f_0$ and $+/- \frac{1}{16} f_0$.

Referring now to FIG. 8, what is shown is that by taking the fixed frequency output fo and designating it as C, one can provide five different tones in which five fixed tones are generated by adding to the fixed frequency $C+\frac{1}{8}C$, $+\frac{1}{16}C$, $-\frac{1}{16}C$, and $-\frac{1}{8}C$. It is this arrangement of tones that permits the multiple frequency generation with the required low phase noise, low spurious content characteristic.

Figure 9:
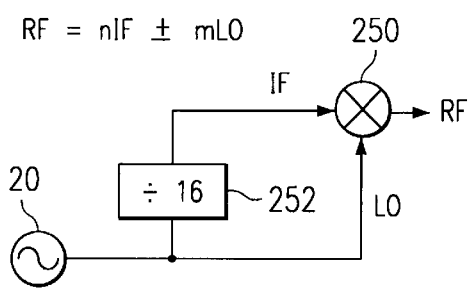
FIG. 9 is a schematic diagram of the utilization of an oscillator having its output mixed with a divided down version of the oscillator signal to provide a new frequency that is a combination of the two, but having a spurious content no closer than the highest common divider between the input frequencies.

In terms of the spectral purity requirements, for the frequencies to be used by a seeker, and referring now to FIG. 9, as is common, an IF can be conceived of as a mixer 250 which is provided with a fixed frequency as from oscillator 20, and at its other input a divided down rendition of the fixed frequency as provided by divider 252. This schematic characterizes a basic IF stage, which is to have a low spurious content. The requirement is that the spurious frequencies must be separated from the desired output frequency by a minimum distance that is established by the divided-by number which is the highest common divider of the system. Here, this divider is illustrated by reference character 252. This sets the minimum spacing of a spur from the fixed frequency, with the requirement being that the spur be no closer than $\frac{1}{16}f_0$ if the divide-by number is 16.

Figure 10:
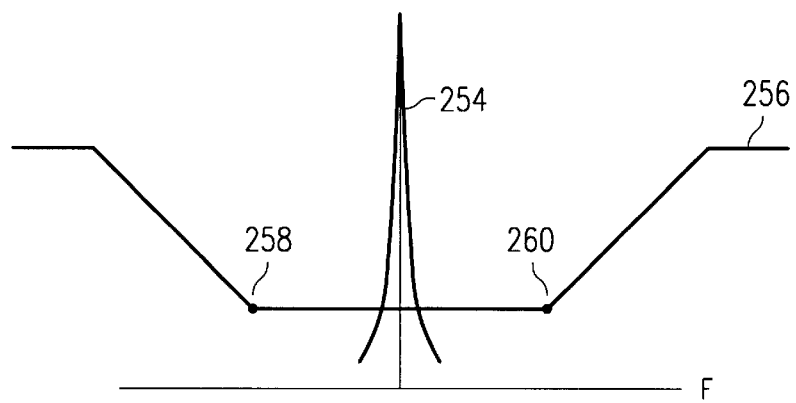
FIG. 10 is a graph showing permissible spurious levels as a function of offset frequencies in the system of FIG. 8.

Referring to FIG. 10, what is shown here is a graph in which the center frequency of the IF of FIG. 9 is shown at 254, with the spurious requirement characteristic being shown by curve 256. Here it will be noted that there are to be no spurs within the closest offset region, here defined by points 258 and 260 on curve 256.

It is a characteristic of the subject system through the utilization of only five tones and the spurious frequency reduction system of the channel synthesizer, that the output of the subject master frequency generator can generate hundreds of frequencies with a small parts count, and with the required spectral purity.

Algorithms for Frequency Generation

Referring now to FIG. 11, one topology for the generation of the multiple frequencies is illustrated in which the topology permits modulo 32 counting. Modulo 32 counting in general relies on base 2 dividers such as illustrated in FIG. 11. In this figure, a divider 300 is a divide-by-8 divider, divider 302 is a divide-by-4 divider, divider 304 is a divide-by-8 divider, and divider 306 is a divide-by-4 divider. When the frequency spacing is K, the step size is $K/128$, whereby the modulo 32 counting system is, in effect, a modulo 128 counting system due to the formula illustrated in FIG. 12, which will be discussed hereinafter.

It will be appreciated that in FIG. 11, tones A, B, C, D and E are applied to a mixer 308, having its other input a divide-down version of tones A and E. It will be noted that mixer 308 utilizes only the upper side band. This is also true for mixer 310, which has as its input tones A, B, C, and D, and the same tones divided-down by 4 as illustrated. Mixer 312 mixes the outputs of mixer 308 and mixer 310, which is divided-down by divider 304, with mixer 312 also utilizing only the upper side band. The output of mixer 312 is divided-down by divider 306, such that the circuit can output 160 frequencies in one embodiment. This output is called $F_{agility}$, which is switchable between multiple frequencies. The $F_{agility}$ output carries reference character 314.

Referring now to FIG. 12, the number of frequencies available at output 314 is such that if $F_1$ is either A, B, C, D or E and if $F_2$ is A or E; and $F_3$ is A, B, C or D, and if $F_4$ is A, B, C, D then $F_{agility}$ is the sum of the weighted $F_1$, $F_2$, $F_3$ and $F_4$ signals noted in this figure. Noting that $F_1=F_A+N_1\times K$ where $N_1=0, 1, 2, 3, 4$; and where $F_2=F_A+N_2\times 4\times K$ where $N_2=0, 1$; and where $F_3$ is $F_A+N_3\times K$, where $N_3=0, 1, 2, 3$; and where $F_4=F_A+N_4\times K$ and $N_4=0, 1, 2, 3$, it can be shown that $F_{agility}=41/128 F_A+K/4(N_1/1+N_2/2+N_3/8+N_4/32)$.

What this means is that given a basic starting frequency and a predetermined step size, there is a maximum and minimum frequency achievable by the circuit of FIG. 11, in which the frequency steps are $K/128$, and in which the lowest frequency that can be generated is $41/128 F_A$.

Note, the maximum frequency generatable is in this case, the lowest frequency+$320/4(4+31/32)$. In the indicated example, given a frequency step of 2.5 MHz, and given an $F_C$ of 5,120 MHz derived from multiplying step size×128× 16, then having defined $F_C$ as the center frequency above and below which $+/-\frac{1}{8}F_C$ and $+/-\frac{1}{16}F_C$ are added, one can then generate or derive K=128 times the step size (2.5 MHz) or 320 MHz, and can define $F_A$ as =5,120 MHz–⅛$F_C$ or 4,480 MHz. Moreover, the minimum frequency generated is⁴¹⁄₁₂₈×$F_A$, where ⁴¹⁄₁₂₈=¼(1+⅛+⅛+¹⁄₃₂). The maximum frequency is given by $Fmax_{agility}=Fmin_{agility}+^{320}/4(4+^{31}/_{32})$. Note, 4+³¹⁄₃₂ represents the total number of 32$^{nds}$ that one is counting, which is ¹⁵⁹⁄₃₂. Thus, 160 frequencies are generated by 159 steps.

The result in this case is that the maximum frequency generatable with these step sizes is 1,832.5 MHz, whereas the minimum frequency is 1,435 MHz.

Figures 14, 15, 16, 17:
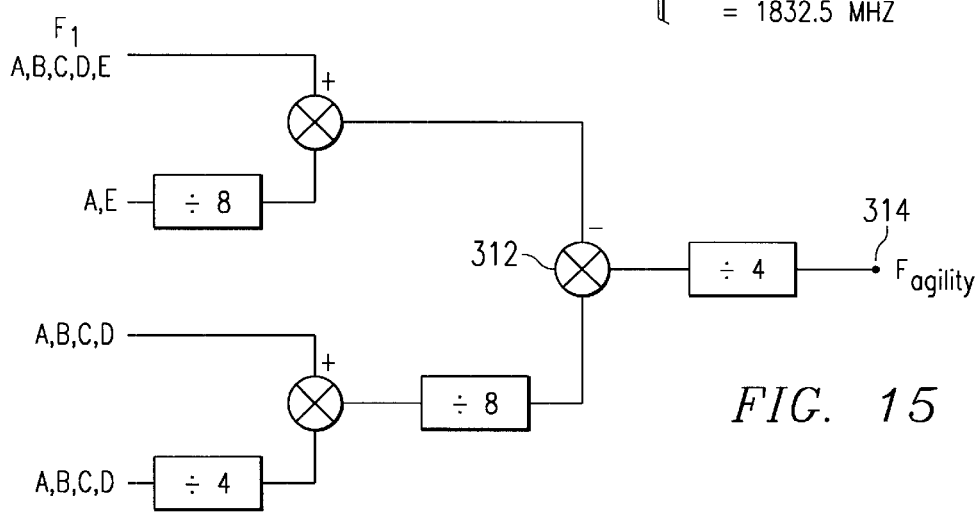
FIG. 14 is a table for one specific example of the output frequencies derivable from the circuit of FIG. 11, indicating a minimum and maximum frequency for a given size step.
FIG. 15 is a schematic diagram of the system of FIG. 11 in which one of the mixers provides as an output to the lower side band.
FIG. 16 is an equation specifying the frequencies available as the output of the circuit of FIG. 15.
FIG. 17 is a table illustrating an example of the frequency range of the circuit of FIG. 15 given a 2.5 MHz step size, and one of the mixers of the FIG. 15 outputting the lower side band.

By a parity of reasoning, referring now to FIG. 15, by simply selecting the lower side band as that which is output by mixer 312, one has a frequency output at output 314 of $F_{agility}=F_A/4(1-^1/_{32})+^K/_4(N_1+N_2/2-N_3/8-N_4/32)$, as shown in FIG. 16.

In the above example, referring now to FIG. 17, the minimum frequency obtainable is 1,047.5 MHz, whereas the maximum frequency available is 1,445 MHz, with 160 different frequencies being obtainable. These different frequencies are different from the frequencies derivable by the circuit of FIG. 11.

Figures 18, 19, 20:
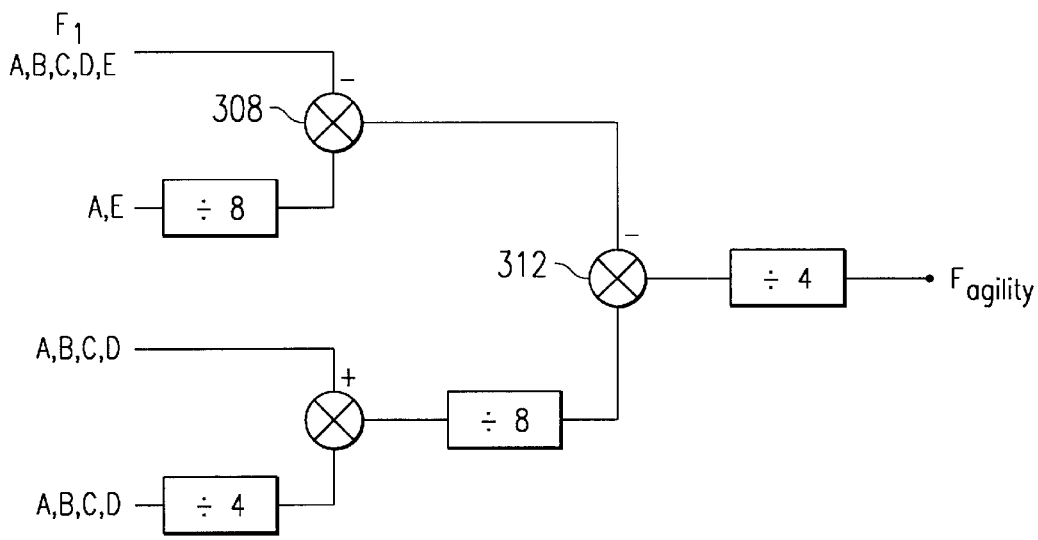
FIG. 18 is a schematic diagram of the circuit of FIG. 11, in which two of the mixers output only lower side bands.
FIG. 19 is an equation describing the frequencies available from the circuit of FIG. 18.
FIG. 20 is a table illustrating the frequency range of frequencies available from the circuit of FIG. 18 in which two of the mixers produce lower side bands, and in which the step size is maintained at 2.5 MHz.

Referring now to FIG. 18, assuming that mixer 308 outputs only its lower side band, with mixer 312 also outputting its lower side band, it can be seen, referring to FIG. 19, that the frequency=$F_A/4(1-⅛-⅛-^1/_{32})+^K/_4(N1-N_2/2-N_3/8-N_4/32)$. This means that the lowest possible frequency obtainable with this topology is 727.5 MHz, whereas the highest frequency in this case is 1,125 MHz.

Figures 21, 22, 23:
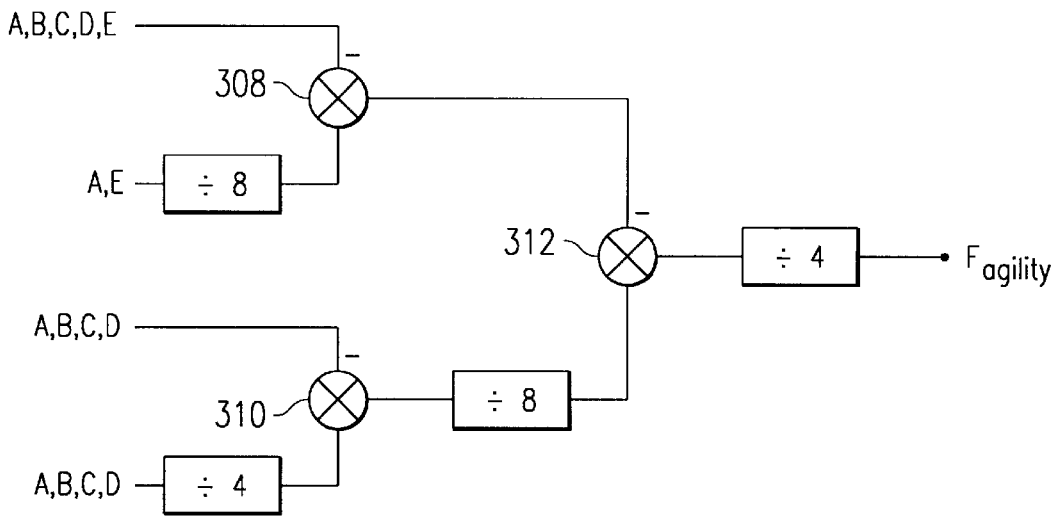
FIG. 21 is a schematic diagram of the circuit of FIG. 11, in which all mixers provide the lower side band as an output thereof.
FIG. 22 is an equation describing the frequencies available from the circuit of FIG. 21.
FIG. 23 is a table describing the frequency range of the circuit of FIG. 21, with all mixers outputting lower side bands, and with the step size being 2.5 MHz.

Finally, as illustrated in FIG. 21, assuming all of the mixers output only the lower side band, then the frequency as illustrated at FIG. 22 is given by $F_A/4(1-^7/_{32})+^K/_4(N-N_2/2-N_3/8+N_4/32)$, where the minimum frequency is 805 MHz, whereas the maximum frequency is 1,202.5 MHz, as illustrated in FIG. 23.

What will be seen is that there is an overlap. This overlap is illustrated in the Table of FIG. 24, and illustrates the provision of continuous coverage in 2.5 MHz steps from 727.5 MHz to 1,832.5 MHz.

What will be appreciated is that each of these 160 frequencies from each of the circuits, are generatable over a significant frequency band in 2.5 MHz steps. Should fine tuning of these frequencies be desired, then as illustrated in FIG. 25, they can be mixed with finer frequency offsets such as that available from a Doppler generator, with the output of the Doppler generator applied to mixer 320. It can be shown that the number of fine-tuned offsets, rather than having steps at 2.5 MHz, can be of a fractional hertz resolution due to the use of standard digital synthesizers.

Figures 24, 25, 26:
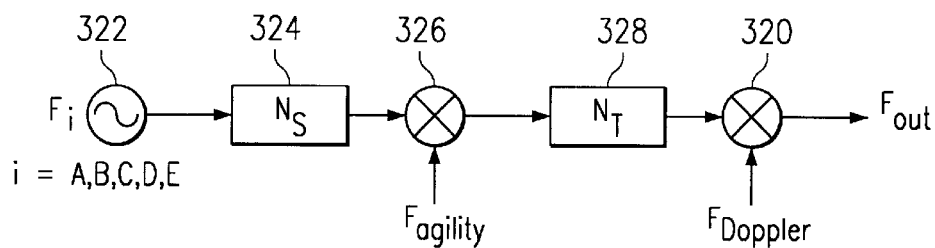
FIG. 24 is a table of possible frequencies for the circuits of FIGS. 11, 15, 18 and 19, in which is the given example, 160 different frequencies are available having a range between 727.5 MHz and 1,832.5 MHz.
FIG. 25 is a block diagram for the generic case, in which a base frequency is multiplied by an integer and mixed with the output of the circuit of a frequency agility circuit, the output of which is again multiplied by an integer, and mixed with a fine tuning frequency to provide a number of different frequencies modified by a number of different fine tuning steps.
FIG. 26 is an equation specifying the output frequency of the circuit of FIG. 25; and, FIG. 27 is a table showing the generation of a number of frequencies generated through the utilization of various multipliers and mixers.

As illustrated in FIG. 25 and most generally, a base frequency $F_i$, here illustrated at 322, can be any of the five tones A, B, C, D or E. Rather than selecting C as the center tone, it will be appreciated that any one of the five tones can be selected as $F_i$. The output from the base tone generator is multiplied at 324 by an integer $N_s$ in this example. The output from the circuit of FIG. 10, for instance output 314, is applied to one input of mixer 326, which outputs both upper and lower side bands. The output of the mixer is applied to a multiplier 328, here-designated $N_T$, the output of which is applied to mixer 320.

Referring now to FIG. 26, it will be seen that the output frequency is $[F_i \times N_s +/- F_{agility}] \times N_T +/- F_{Doppler}$. Assuming that the multiplier for multiplier 324 is 3, and the multiplier for multiplier 328 is 2, and assuming that $F_i$=4,480, 4,800, 5,120 and 5,760 MHz, and assuming a range of 727.5 MHz to 1,832.5 MHz, and assuming an $F_{Doppler}$ of between 3,200 MHz and 5,760 MHz, then as illustrated in the Table of FIG. 27, where $N_s$ is either 2, 3, or 4, continuous frequency coverage exceeding 20 to 40 GHz is possible. This frequency range is accomplished through the utilization of multipliers 324 and 328, as well as mixers 326 and 320.

Note that any frequency range can be obtained by simply scaling the basic five tones by factors of 2, i.e., 5,120/2. By doing so, one obtains a 10–20 GHz frequency coverage at a 1.25 MHz step size. The ability to scale the base frequencies is facilitated by having octave coverage at the output. What this means is that for every frequency doubling, the output frequency coverage will double, and the step size will double.

In summary, what has been provided is a convenient five-tone system for being able to generate hundreds and hundreds of frequencies throughout a wide band. It is the five tones plus the particular topology or architecture of dividers and mixers which permits the utilization of only five tones to provide this wide frequency coverage.

With respect to spurious rejection, it will be appreciated that at critical nodes in the circuit of FIG. 11 there is an approximate 8 to 1 frequency relationship between the input to a mixer at the IF port and the LO port thereof. For those mixers which have only a 4 to 1 ratio, the inputs to these mixers are such that whatever spurs are generated are corrected by a divider downstream of the mixer, which in essence provides an approximate 8 to 1 ratio. Note that the spurs generated at the output of mixer 310 are corrected by approximately 30 dB, due to the divide-by-8 divider 304 and the divide-by-4 divider 306, in which the spurious content is reduced by 20 times the log of the division ratio. In this case, the division ratio is 32, or 4 times 8.

It will be noted that it is the tone spacing that sets the spurs at particular offsets, and it is the mixers that generate the inter-modulation spurs. However, the spurs produced by the mixers are reduced by the dividers. In essence, in the subject invention, there is an upconversion, expansion, and divide-down, which eliminates the spurs or at least reduces the spurious content.

Having now described a few embodiments of the invention, and some modifications and variations thereto, it should be apparent to those skilled in the art that the foregoing is merely illustrative and not limiting, having been presented by the way of example only. Numerous modifications and other embodiments are within the scope of one of ordinary skill in the art and are contemplated as falling within the scope of the invention as limited only by the appended claims and equivalents thereto.

What is claimed is:

1. A system for generating a plurality of substantially spur-free frequencies for use in the generation of substantially spur-free RF signals in which at least some of the plurality of frequencies are preselected, comprising:

a master frequency generator for generating a plurality of tones; and a first mixer, including a channel synthesizer for mixing selected ones of said plurality of tones thereby generating one of said preselected frequencies, and a frequency offset synthesizer for mixing said one of said preselected frequencies with a predetermined frequency offset signal.

2. A system in accordance with claim 1, wherein said plurality of tones is five tones, and wherein a relationship between said five tones is $f_0, f_0+⅛f_0, f_0-⅛f_0, f_0+^1/_{16}f_0,$ and $f_0-^1/_{16}f_0$.

3. A system in accordance with claim 1, wherein said plurality of tones is five tones, and wherein said master frequency generator includes a reference oscillator, a divide-by-8 divider coupled to an output of said reference oscillator, a divide-by-2 divider coupled to an output of said divide-by-8 divider, a combiner for combining the output of said divide-by-8 divider and an output of said divide-by-2 divider, a second mixer for mixing an output of said combiner and the output of said reference frequency oscillator, and a separator, coupled to an output of said second mixer, for separating the output of said second mixer into four of said five tones, wherein the fifth of said five tones is the output of said reference oscillator.

4. A system in accordance with claim 3, wherein said separator includes a quadraplexer.

5. A system in accordance with claim 1, and further including a missile seeker having a millimeter radar transmitter for transmitting radar signals in one of a plurality of frequency channels, wherein said channel synthesizer is capable of generating a plurality of frequencies from said plurality of tones, and wherein said first mixer includes a reference oscillator and an up-converter coupled to both said reference oscillator and said channel synthesizer, said first mixer generating one of said RF signals, said one of said RF signals having a frequency in one of said plurality of frequency channels specified by said channel synthesizer.

6. A system in accordance with claim 1, wherein the system further includes up-conversion by mixing followed by a divider resulting in substantially spur-free RF signals.

7. A system in accordance with claim 6, wherein said frequency offset synthesizer is a Doppler offset synthesizer, and wherein at least one of said preselected frequencies generated by said channel synthesizer is mixed with a predetermined frequency offset signal from said Doppler offset synthesizer.

8. A system in accordance with claim 1, wherein said plurality of tones is five tones, and wherein a relationship between said five tones is $f_0$, $f_0+\frac{1}{4}xf_0$, $f_0-\frac{1}{4}xf_0$, $f_0+\frac{1}{2}xf_0$, and $f_0-\frac{1}{2}xf_0$.

9. A system in accordance with claim 1, wherein a relationship between said plurality of tones is a non-integer multiple.

10. A system in accordance with claim 1, wherein said plurality of tones is at least five tones, and wherein a relationship between said five tones is a non-integer multiple.

11. A system in accordance with claim 1, wherein a number of the substantially spur-free frequencies generated satisfies an equation $$F = 41/128\ F_A + K/4(N_1/1 + N_2/2 + N_3/8 + N_4/32)$$

where F is the number of substantially spur-free frequencies to be generated, $F_A$ is the lowest tone, K is the tone spacing, and N is one of 0 and an integer.

12. A system in accordance with claim 1, wherein said master frequency generator is provided with a master frequency oscillator and said master frequency oscillator generates said plurality of tones.

13. A system in accordance with claim 1, wherein there is a non-harmonic relationship between ones of said plurality of tones.

14. A system in accordance with claim 1, wherein said plurality of tones comprises at least one pair of tones symmetrically offset about a central one of said plurality of tones, and wherein there is a non-harmonic relationship between said plurality of tones.

15. A system in accordance with claim 1, wherein said plurality of tones comprises at least two pair of tones symmetrically offset about a central one of said plurality of tones, and wherein one pair of said at least two pair of tones has a non-harmonic relationship with respect to another pair of said at least two pair of tones and said central one of said plurality of tones.

* * * * *